PRINTED CIRCUIT BOARD PROVIDED WITH A JUNCTION CIRCUIT BREAKER HAVING A SLIDABLE AND ROTATABLE ARMATURE

Filed Oct. 26, 1962 2 Sheets-Sheet 1

INVENTOR.
CARL E. KEENE
BY Wade Koontz
Sherman H. Goldman
ATTORNEYS

Feb. 16, 1965 C. E. KEENE 3,170,056

PRINTED CIRCUIT BOARD PROVIDED WITH A JUNCTION
CIRCUIT BREAKER HAVING A SLIDABLE
AND ROTATABLE ARMATURE

Filed Oct. 26, 1962 2 Sheets-Sheet 2

INVENTOR.
CARL E. KEENE
BY Wade Koontz
Sherman H. Goldman
ATTORNEYS

United States Patent Office 3,170,056
Patented Feb. 16, 1965

3,170,056

PRINTED CIRCUIT BOARD PROVIDED WITH A JUNCTION CIRCUIT BREAKER HAVING A SLIDABLE AND ROTATABLE ARMATURE

Carl E. Keene, 13809 East Ave. G–8, Lancaster, Calif.
Filed Oct. 26, 1962, Ser. No. 233,492
2 Claims. (Cl. 200—166)
(Granted under Title 35, U.S. Code (1952), sec. 266)

The invention described herein may be manufactured and used by or for the United States Government for governmental purposes without payment to me of any royalty thereon.

This invention relates generally to information handling and more particularly to a system and related apparatus such as printed circuit cards, call boards, computer programming panels, experimental laboratory boards and other similar structures.

The system comprises a co-ordinate form sheet which is utilized to show the position, type and number of components on a given card or board. The cards have vertical and horizontal parallel lines of conductors that are insulated from each other and form a conventional co-ordinate system. The system contemplates a circular variation of the cards and boards where the conductors may be mounted either as a plurality of concentric semicircles or as a plurality of radii. The arrangement within this system allows for the conductors on the boards to be either on a single axis with the components making up the complementary axis or the conductors may be on the two axes on the same board. As a part of the system, a novel circuit junction breaker with a moveable armature is arranged to fit in a hole in the board in the circuit open position. When the circuit breaker is utilized to close the circuit, its pivotal mounting allows it to be moved from the hole into contact with a conductor line. The change in position allows light from a fluorescent panel to shine through the now open hole to indicate to the observer the position of the switch.

The proposed system has as an object the provision for simplification of both the design and communication of the electronic and electrical circuitry. In addition, the system enables a standardization which supports compatibility of a large number of printed circuit cards and facilitates the ultimate in close packaging of circuit components. The storage and cataloguing of circuitry is adaptable for acceptance by digital recorders such as punch cards, perforated tape, magnetic tape, etc.

It is another object of this invention to provide an efficient and expedient prefabricated laboratory experimental board which may be utilized with the system of this invention.

Still another object of this invention involves the provision of a novel printed circuit board having X and Y co-ordinates which comprise conductors, each insulated from the other, and a novel circuit maker and breaker at the junctions of the X and Y co-ordinate conductors in order to eliminate the use of soldering and the resultant destructive heat which is attained thereto.

It is a further object of this invention to provide a novel printed circuit board which allows for experimentation with the circuitry without cumbersome soldering procedures.

It is a still further object of this invention to provide a novel circuit breaker for printed circuit panels which is easy and economical to manufacture of conventional, currently available components that lend themselves to standard mass production manufacturing techniques.

These and other advantages, features and objects of the invention will become more apparent from the following description taken in connection with the illustrative embodiments in the accompanying drawings, wherein.

Figure 1:
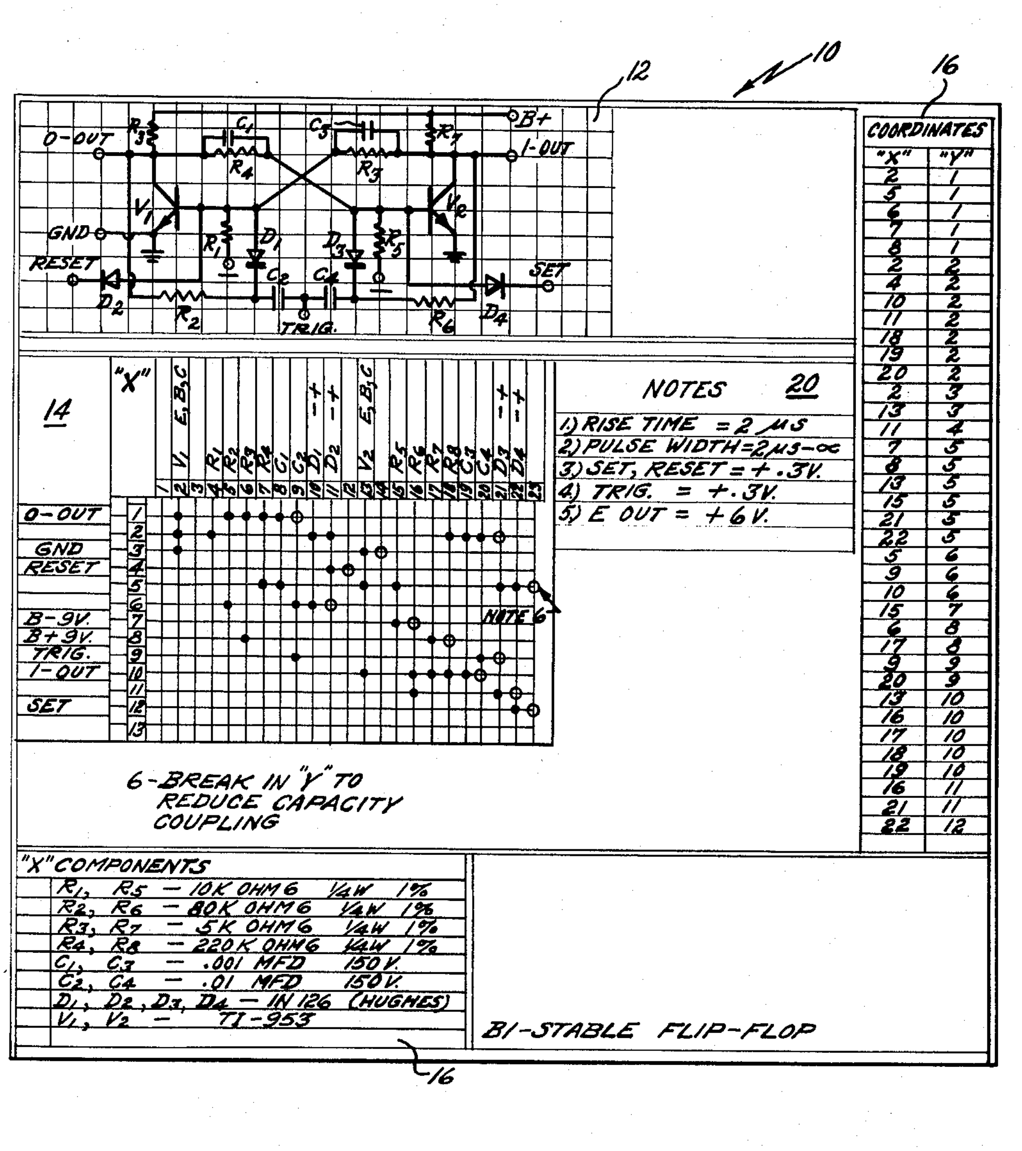
FIGURE 1 is a presentation of a sheet illustrating the system of this invention.

The system of this invention may be described relative to FIGURE 1 wherein a sheet 10 of paper is depicted which is utilized to prepare a circuit board for a bi-stable flip-flop circuit. The particular circuit utilized is illustrative, and the invention may be applied to other circuits. The first step of performing the method of the novel system is to draw in the section, designated with the numeral 12, the schematic of the design circuit. Section 12 has both vertical and horizontal lines which serve as a guide for future programming of the circuit.

The circuit components are listed in the space provided in the section, designated with the numeral 14, of the sheet opposite the X axis co-ordinate numbers and are designated as to their electrical connections in the circuit such as V1, E.B.C. showing the order employed in the circuit as emitter, base and collector. The components may be inserted at random or in any desired order. As illustrated in FIGURE 1 each vertical and horizontal line represents a separate conductor with no electrical connection to any other until so designated by a dot placed at the desired junction. By this method, continuity between any X—Y, Y—Y or X—X conductor may be obtained. The columns designating the axes utilize unlabeled conductors in order to provide for wiring between the labeled elements, all of which becomes apparent when one checks the schematic shown in section 12 with the connections indicated at section 14. The Y co-ordinate also has listed the desired function for each conductor. Section 16 of the sheet allows for a listing of the components with their specifications, while a separate section 18 allows for transfer of the co-ordinates from section 14 in a convenient listing. Pertinent notes may be added in other sections of the sheet as indicated at 20.

The co-ordinates represent a reduction of the schematic to digital and letter form which may be transferred to punch cards, perforated tape, magnetic tape, typed or any desired system with a high degree of accuracy. In addition, telemetry may be utilized for the transmission of the schematic in its new form. The system thus far described, allows for the communication of an electronic schematic.

When the above-described system is utilized for design work, random component placement is not utilized on the X axis. Instead, the components are placed on the surface of the card rather than along the edge when the card is assembled, and the size and terminal arrangement of the components must be taken into consideration when the co-ordinate junctions are laid out in order to facilitate adequate mounting and space for the components. This limitation is reflected on the Y axis since the functions must be chosen to agree with connector designations.

Figure 2:
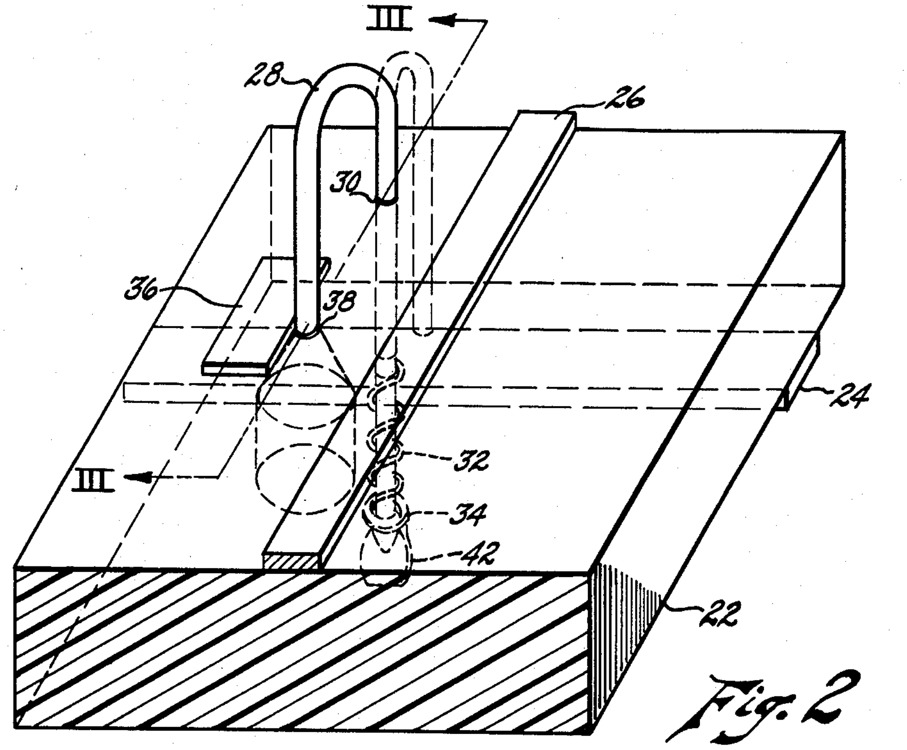
FIGURE 2 is a perspective view of a portion of a prefabricated board utilizing the novel circuit breaker of this invention with one position of the breaker being shown in phantom lines.
Figure 3:
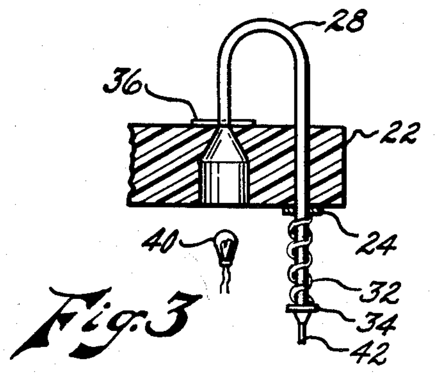
FIGURE 3 is a sectional view taken on lines III—III of FIGURE 2.

As shown in FIGURES 2 and 3, a portion of a laboratory experimental board 22 of dielectric is shown which has a number of horizontal conductors 24 on one side of the board and an equal number of vertical conductors 26 on the other. The horizontal conductors represent the Y axis while the vertical form the X axis. At each junction of the X and Y conductors 24 and 26 provision is made for making or breaking the circuit, as desired, in the experimentation with various circuitry.

An example of the type of spring clip which is used as the circuit maker or breaker is illustrated in these figures and comprises a moveable armature 28 of copper clad spring steel which is bent in a generally U-shape with one leg of the U of a longer length than the other. A hole is drilled at 30 in the prefabricated board 22 and the longer end of the U-shape armature extends therethrough. On the side of the board containing the Y conductor an electrically conductive spring 32, having flat, ground ends, is inserted over the leg of the U and a retaining washer 34 is utilized adjacent the end of the leg in contact with the compression spring. Crimping or other means are utilized to inhibit removal of the retainer 34 and spring 32.

Thus, the spring biasing action on the U-shaped armature 28 enables contact to be made with the Y conductor 24 and the X conductor 26 when the armature is rotated from the solid line to the phantom line position. Silver plating and a rhodium flashing provide for low resistance and longer wear, respectively, for the armature. The compression spring 32 insures stability of the positioning of the armature and provides constant pressure to reduce contact resistance. The wiping action of the armature 32 in its rotation to and from the circuit closing position aids in the maintenance of a clear contact area. A stop 36 and detent 38 are provided for holding the armature in the open circuit position and also are utilized as an indicator of the closed circuit condition. The detent 38 comprises a hole through the circuit board 22 and does not intersect with any of the conductors.

If desired, an additional stop means may be provided to limit the movement of the armature to the X conductor. In order to utilize the detent as an indicator, a light or illuminating panel 40 is mounted on one side of the board to show whether or not the individual detents are being utilized for, if the circuit is in a closed position, light will pass through the individual detent holes while the converse will be true when the armature 28 blocks the detent in the circuit open position.

Provision is also made for clearing the panel by fixing on the end of the armature 28 adjacent the washer 34 a winged cap 42 such that, when the armature 28 is in its closed position in contact with conductor 26, the wings will be oriented perpendicular to the row of conductors 24. Thus, a comb having one tooth spaced for each row may be drawn down the row and its action upon the wing will rotate the armature 28 from its phantom position to the solid line position of FIGURE 2. The winged cap 42 may be utilized in place of retaining washer 34, if desired.

When utilizing the system of this invention either with or without the particular circuit breaking means, unwanted conductors and breaks in a particular conductor may be made in accordance with the program. In addition, the orientation of the conductors may be either radially or concentrically located, while the particular components to be utilized may be mounted between adjacent boards, each of which has one of the like oriented conductors mounted on a single board. If a circuit board is not to be experimented with, a coating of silicone varnish, synthetic rubber or a complete potting may be utilized to complete the assembly.

Although this invention has been described relative to a particular embodiment, it should be understood that the invention is capable of a variety of alternative embodiments without departing from the spirit and scope of the appended claims.

What I claim is:

1. A junction circuit breaker, a printed circuit board, said printed circuit board comprising two conductors separated from each other by an insulating card, a U-shaped armature having legs of unequal length, the longer leg of said armature extending through said insulation card and one of said conductors, said armature being rotatable and slidable in said insulating card such that the shorter leg of said U-shaped armature may be engaged with the other of said conductors, spring means on said longer leg of said U-shaped armature for biasing said armature downwardly against said other conductor, retaining means for securing said spring on said armature, a hole through said insulating card for receiving said shorter leg of said U-shaped armature when said armature is rotated from its contact with said other conductor to circuit open position, and means for producing light on one side of said insulating card such that, when said armature is in circuit closed position, light is allowed to pass through said hole and in a circuit opened position the passage of light is blocked.

2. A junction circuit breaker as defined in claim 1 including means on the end of said longer leg of said U-shaped armature, said means having projections thereon which extend beyond the periphery of said longer leg for turning said armature between circuit open and circuit closed position.

References Cited by the Examiner

UNITED STATES PATENTS 2,671,149 3/54 Hubbell et al. ---------- 200—159

BERNARD A. GILHEANY, *Primary Examiner.*